United States Patent
Chae et al.

(10) Patent No.: US 7,254,076 B2
(45) Date of Patent: Aug. 7, 2007

(54) SEMICONDUCTOR MEMORY DEVICE FOR IMPROVING RESPONSE MARGIN OF REDUNDANCY FLAG SIGNAL AND REDUNDANCY DRIVING METHOD FOR THE SAME

(75) Inventors: Dong Hyuk Chae, Seoul (KR); Young Ho Lim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/317,303

(22) Filed: Dec. 27, 2005

(65) Prior Publication Data

US 2007/0076497 A1    Apr. 5, 2007

(30) Foreign Application Priority Data

Oct. 5, 2005    (KR)    ............... 10-2005-0093195

(51) Int. Cl.
*G11C 7/02*    (2006.01)
(52) U.S. Cl. ............... 365/207; 365/233; 365/205; 365/189.05; 365/185.09; 365/239; 714/761; 714/762
(58) Field of Classification Search ............ 365/207, 365/233, 205, 189.05, 230.08; 36/185.09; 714/761, 762
See application file for complete search history.

(56) References Cited

U.S. PATENT DOCUMENTS 6,134,179 A * 10/2000 Ooishi ............... 365/233
6,285,606 B1 * 9/2001 Ozeki ............... 365/200

FOREIGN PATENT DOCUMENTS

| JP | 10-74386 | 3/1998 |
|---|---|---|
| JP | 2001236794 | 8/2001 |
| KR | 1020050027922 A | 3/2005 |

OTHER PUBLICATIONS

KO 1999-0065226, Aug. 5, 1999.
KO 1999-0079136, Nov. 5, 1999.

* cited by examiner

*Primary Examiner*—Richard T. Elms
*Assistant Examiner*—Eric J. Wendler
(74) *Attorney, Agent, or Firm*—Volentine & Whitt, PLLC

(57) ABSTRACT

A burst mode compatible semiconductor memory device having a redundancy memory adapted to repair a normal memory is disclosed. Response margin for a redundancy flag signal and redundancy driving method is improved by sensing generation of an internal address corresponding to an embedded address, and generating a redundancy flag signal, such that the embedded address is an address preceding the address of the memory cell of the normal cell array to be repaired by at least one clock.

18 Claims, 9 Drawing Sheets

SEMICONDUCTOR MEMORY DEVICE FOR IMPROVING RESPONSE MARGIN OF REDUNDANCY FLAG SIGNAL AND REDUNDANCY DRIVING METHOD FOR THE SAME

BACKGROUND OF THE INVENTION

1. Field of the Invention

Embodiments of the invention relate to semiconductor memory devices. More particularly, embodiments of the invention relate to semiconductor memory devices adapted to perform a burst operation accessing memory cells in response to sequentially generated internal addresses.

2. Description of the Related Art

Conventional semiconductor memory devices often include a normal cell array having a plurality of memory cells arranged in a matrix of rows and columns, and a redundant cell array having memory cells used to repair defective memory cells in the normal cell array. Many conventional semiconductor memory devices are also adapted to operate in so-called "burst mode." Burst mode operations are generally characterized by accessing a plurality of data bits, the number of which is defined by a value termed "burst length," in response to a single command.

FIG. 1 is a block diagram of a flash memory—one common type of conventional semiconductor memory device. Referring to FIG. 1, an address buffer 31 latches and buffers an external address EXADDR provided by an external input/output line or bus (I/O). Further, an address counter 35 generates a sequentially changing internal address INADDRi, based on a buffered address BADDR provided by the address buffer 31. A page buffer/Y-gate 13 associated with a normal cell array 11 is enabled in response to the internal address INADDRi decoded by an address decoding unit 40. A redundancy decider 51 activates a redundancy flag signal REDFL when the internal address INADDRi, which corresponds to an embedded address READDR, is generated.

A data input driver 61 receives data from a buffering input line BDI and provides it to either a normal input line NDI or a redundancy input line RDI in response to an input driving signal DICLK (e.g., a defined clock signal). In this case, the direction (e.g., NDI or RDI) to which the data apparent on the buffering input line BDI is driven is determined by the redundancy flag signal REDFL. In similar vein, a data output multiplexer (MUX) 63 receives data via a normal output line NDO or a redundancy output line RDO and provides the data to a multiplexing (muxing) output line MDO in response to the redundancy flag signal REDFL. In this case, the origin (e.g., NDO or RDO) of the data to be provided to the muxing output line MDO is determined by the redundancy flag signal REDFL.

A data latch buffer 65 provides data received from the external input/output line (I/O) to the buffering input line BDI. Further, the data latch buffer 65 latches data received from the muxing output line MDO, as well as an internal local output line LDO (not shown) in response to an output latch signal DLCLK2. Subsequently, this latched data is provided to the external input/output line (I/O) in response to a read enable signal /RE applied to control logic unit 80.

In fact, the control logic unit 80 receives externally provided and conventionally understood external control signals /CE, /RE, /WE, CLE, and ALE, and generates a plurality of internal control signals, including AICLK, XIA, CNCLK, DICLK, DLCLK1, DLCLK2 and SCON in response to one or more of the external control signals /CE, /RE, /WE, CLE and ALE. The operational timing of the exemplary semiconductor memory device shown in FIG. 1, as well as the relationship between the foregoing control signals will be described in some additional detail in relation to FIGS. 2 and 3 and relative to a data input mode and a data output mode.

In FIGS. 2 and 3, a burst mode operation (e.g., one continuously changing the column address) is illustrated. In this example, a column address at which the burst operation starts is assumed to be ADDR(N). As shown in FIG. 2 and with reference to FIG. 1, it is assumed that a redundant memory cell in the redundant cell array 21 is accessed, instead of a memory cell of the normal cell array 11 corresponding to a column address of ADDR(N+1). As shown in FIG. 3 and with reference to FIG. 1, it is further assumed that another redundant memory cell in the redundant cell array 21 is accessed, instead of a memory cell of the normal cell array 11 corresponding to a column address of ADDR(N+2).

Referring to FIGS. 2 and 3, at intervals p21 and p31 during which a command latch enable signal CLE is "activated" (i.e., transitions to a logically high (H) state or level, or "goes high"), a command controlling the operational mode of the semiconductor memory device is received. At intervals p22 and p32 during which an address latch enable signal ALE is activated, the external address EXADDR is latched by address buffer 31.

Thereafter, in the data input mode illustrated in FIG. 2, input data is stored in the page buffer 13 of the normal cell array 11, or in the page buffer 23 of the redundant cell array 21. Analogously, in the data output mode illustrated in FIG. 3, output data is latched in the page buffer 13 of the normal cell array 11, or in the page buffer 23 of the redundant cell array 21.

Thereafter, data from the memory cell of the normal cell array 11 corresponding to the internal address INADDRi decoded by the address decoding unit 40 is provided to the normal output line NDO, while data from the memory cell of redundant cell array 21 is provided to the redundancy output line RDO.

In the input mode illustrated in FIG. 2, the redundancy flag signal REDFL is activated in response to the internal address INADDRi generated as ADDR(N+1) at time t21. In response to the internal address INADDRi generated as ADDR(N+2), the redundancy flag signal REDFL is deactivated (i.e., transitions to a logically low (L) state or level, or "goes low") at time t22. In the output mode illustrated in FIG. 3, the redundancy flag signal REDFL is activated in response to the internal address INADDRi generated as ADDR(N+2) at time t31, but deactivated in response to the internal address INADDRi generated as ADDR(N+3) at time t32.

When the operating frequency of the foregoing exemplary semiconductor memory device increases or when the operating voltage (e.g., VCC) supplied to thereto decreases, the response speed of the redundancy decider 51 will generally slow. In this case, the response margin associated with the redundancy flag signal REDFL will become markedly decreased.

Within the data input mode of the conventional semiconductor memory device, the response margin associated with the redundancy flag signal REDFL, as measured from the time the internal address INADDRi is generated, is limited to a period t21 of about ½ the clock cycle of the input driving signal DICLK. There is a problem in that, if the activation timing of redundancy flag signal REDFL lags, for example, from t21 to t21' and from t22 to t22', data D2 corresponding to the address ADDR(N+2), rather than data D1 corresponding to the address ADDR(N+1) will be driven onto the redundancy input line RDI at t23' and t24', etc.

Further, within the output mode of the conventional semiconductor memory device, data on the muxing output line MDO depends on the response speed of the redundancy flag signal REDFL. That is, if the response speed of the redundancy flag signal REDFL lags, for example, from t31 to t31' and from t32 to t32', the data transfer window assigned to data DO2 on the muxing output line MDO and corresponding to the address ADDR(N+3) will be compressed. In this case, there is a problem that data DO2 from the normal cell array 11, rather than data RDO from the redundant cell array 21, is latched in response to the clock of the output latch signal DLCLK2 corresponding to the address ADDR(N+2), and data RDO from the redundant cell array 21, rather than data DO3 from the normal cell array 11, is latched in response to the clock of the output latch signal DLCLK2 corresponding to the address ADDR(N+3). That is, the conventional semiconductor memory device is problematic in that the precision with which data is latched in response to the output latch signal DLCLK2 decreases.

Consequently, the conventional semiconductor memory device suffers from several problems associated with the response margin of the redundancy flag signal, as defined in relation to the generation timing of an internal address INADDRi.

SUMMARY OF THE INVENTION

Recognizing the foregoing, embodiments of the present invention provide a semiconductor memory device having an increased response margin relative to a redundancy flag signal.

Thus, in one embodiment, the invention provides a semiconductor memory device, comprising; a normal cell array comprising a plurality of memory cells arranged in a matrix of rows and columns, a redundant cell array comprising a plurality of memory cells adapted to replace memory cells in the normal cell array, an address input unit adapted to generate an internal address that sequentially changes in response to a counted signal, an address decoding unit for decoding the internal address to specify a memory cell in the normal cell array, a redundancy enable unit adapted to generate a redundancy shift signal that is activated in response to the generation of the internal address corresponding to an embedded address, and a data input/output unit controlled such that input data is provided to the redundant cell array instead of the normal cell array in response to the redundancy shift signal, wherein the embedded address corresponds to an internal address preceding the internal address specifying a memory cell in the normal cell array to be repaired by a number of shift clocks, wherein the number of shift clocks is defined by an integer equal to or greater than 1.

In another embodiment, the invention provides a flash memory device adapted for use in a burst mode operation, comprising; a normal cell array comprising a plurality of NAND-type non-volatile memory cells arranged in a matrix of rows and columns, a redundant cell array comprising a plurality of NAND-type non-volatile memory cells adapted to replace the NAND-type non-volatile memory cells of the normal cell array, an address input unit adapted to generate an internal address that sequentially changes in response to a counted signal and in accordance with a burst value defining the burst operation, an address decoding unit adapted to decode the internal address to specify a memory cell in the normal cell array, a redundancy enable unit adapted to generate a redundancy shift signal in response to the generation of an internal address corresponding to a predetermined embedded address, and a data input/output unit controlled such that data from the redundant cell array, instead of the normal cell array, is output in response to the redundancy shift signal, wherein the embedded address corresponds to an internal address preceding the internal address specifying a memory cell in the normal cell array to be repaired by a number of shift clocks, wherein the number of shift clocks is defined by an integer equal to or greater than 1.

In yet another embodiment, the invention provides a redundancy driving method for a semiconductor memory device comprising a normal cell array and a redundancy cell array, comprising; generating a sequentially changing internal address that specifies a memory cell in the normal cell array in response to a counted signal, sensing generation of an internal address corresponding to an embedded address, activating a redundancy flag signal, and in response generating a redundancy shift signal from the redundancy flag signal, and controlling a data input operation such that input data is applied to the redundant cell array instead of the normal cell array in response to the redundancy shift signal, wherein the embedded address corresponds to an internal address preceding the internal address specifying a memory cell in the normal cell array to be repaired by a number of shift clocks, wherein the number of shift clocks is defined by an integer equal to or greater than 1.

In still another embodiment, the invention provides a redundancy driving method for a semiconductor memory device comprising a normal cell array and a redundancy cell array, comprising; generating a sequentially changing internal address that specifies a memory cell in the normal cell array in response to a counted signal, sensing generation of an internal address corresponding to an embedded address, activating a redundancy flag signal, and in response generating a redundancy shift signal from the redundancy flag signal, and controlling a data output operation such that output data is received from the redundant cell array instead of the normal cell array in response to the redundancy shift signal, wherein the embedded address corresponds to an internal address preceding the internal address specifying a memory cell in the normal cell array to be repaired by a number of shift clocks, wherein the number of shift clocks is defined by an integer equal to or greater than 1.

BRIEF DESCRIPTION OF THE DRAWINGS

Several embodiments of the invention will be described with reference to the accompanying drawings, in which.

DESCRIPTION OF EXEMPLARY EMBODIMENTS

In the description of exemplary embodiments that follows, an operational mode adapted to store externally provided data in an internal memory cell will generally be referred to as a "data input mode." In similar fashion, an operation mode adapted to access data stored in the internal memory cell of a semiconductor memory device and provide it to an external circuit will generally be referred to as a "data output mode."

Several embodiments of the invention will now be described in some additional detail with reference to the attached drawings.

Figure 4:
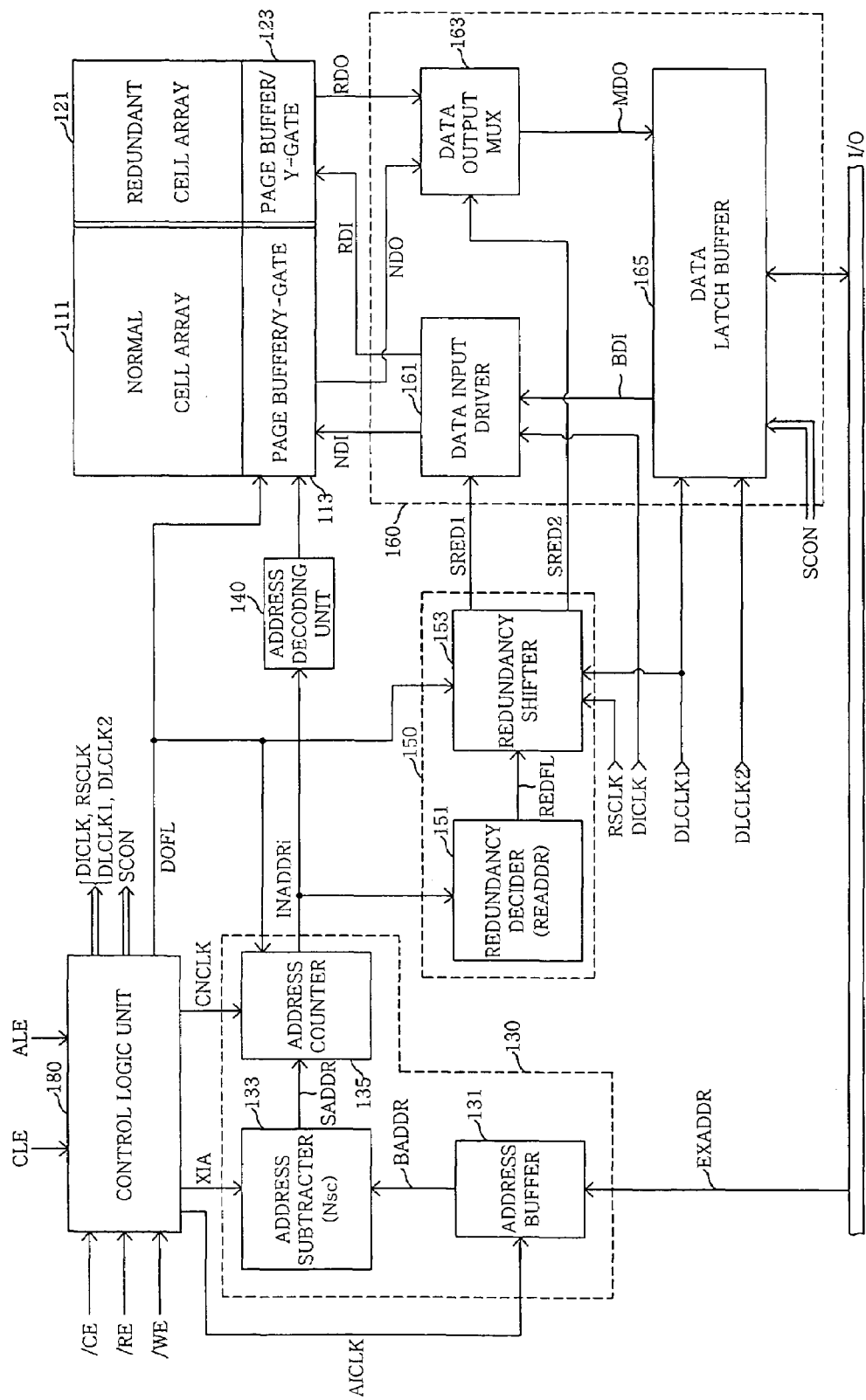
FIG. 4 is a block diagram of a semiconductor memory device according to an embodiment of the present invention.

FIG. 4 is a block diagram of a semiconductor memory device according to an embodiment of the present invention. Referring to FIG. 4, the semiconductor memory device comprises a normal cell array 111 and a redundant cell array 121. Data stored in the memory cell of the normal cell array 111 is input or output through a corresponding page buffer/Y-gate 113. Further, data stored in the memory cell of the redundant cell array 121 is input or output through a corresponding page buffer/Y-gate 123.

Figure 5:
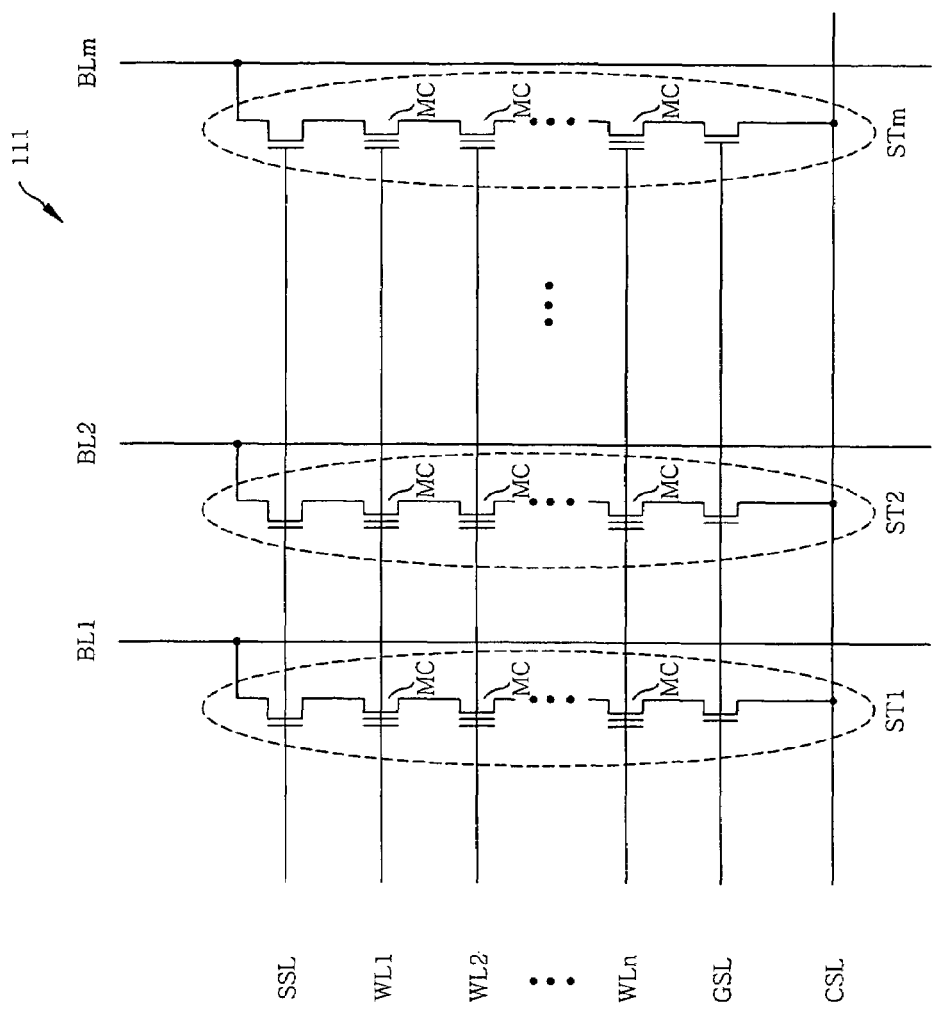
FIG. 5 is a diagram further illustrating the normal cell array of FIG. 4.

As shown, for example, in FIG. 5, the normal cell array 111 may include a plurality of memory cells MCs arranged in a matrix of rows, as specified by word lines WL1 through WLn, and columns, as specified by bit lines BL1 through BLm. For reference, FIG. 5 illustrates a normal cell array 111 composed of NAND-type flash memory cells arranged in a plurality of cell strings ST1 through STm . Each cell string ST1 through STm essentially connects to a plurality of memory cells MCs in series. In FIG. 5, a string select signal SSL is used to control the selection of cell strings ST1 through STm , a common source line CSL is used to commonly transmit a source voltage to the cell strings ST1 through STm, and a ground select signal GSL is used to selectively supply a common source voltage to the memory cells of the cell strings ST1 through STm.

The exemplary semiconductor memory illustrated in FIGS. 4 and 5 is assumed to operate in a burst mode of operation in which a plurality of data bits, as defined by a corresponding burst length value, may be programmed to or read from the semiconductor memory device in response to a single command and/or a received external address EXADDR. With this assumption in place, a series of sequential internal addresses may be consecutively generated by the semiconductor memory device in relation to the external address EXADDR. In response to these sequential internal addresses, a corresponding plurality of memory cells may be accessed (e.g., programmed to or read from).

With the following working assumptions in mind, one embodiment of the invention will be described in relation to an exemplary NAND-type flash memory adapted to perform a burst mode operation. This technical description is, however, merely one possible application of the invention. That is, the invention is not limited to only NAND-type flash memory, but its teachings may be applied to all semiconductor memory devices in which, as column addresses or row addresses are consecutively changed with respect to a single external address, memory cells corresponding to the addresses can be consecutively accessed.

Referring now to FIG. 4, the redundant cell array 121 includes a plurality of memory cells. The memory cells of redundant cell array 121 are used to "repair" (i.e., replace or substitute for) defective memory cells in the normal cell array 111. Within a semiconductor memory device having this capability, if an address for selecting a memory cell in the normal cell array 111 required repair, the signal path allowing access to the normal cell array 111 is interrupted, and a replacement path of sorts allowing access to the redundant cell array 121 is formed. In the subject description, memory cells included in the normal cell array 111 are termed "normal memory cells" and memory cells included in the redundant cell array 121 are termed "redundant memory cells."

Referring still to FIG. 4, the exemplary semiconductor memory device further comprises an address input unit 130, an address decoding unit 140, a redundancy enable unit 150 and a data input/output unit 160.

The address input unit 130 comprises circuitry adapted to generate the internal address INADDRi based on the external address EXADDR received from the external input/output line (I/O). In one embodiment, the address input unit 130 comprises an address buffer 131, an address subtracter 133 and an address counter 135. The address buffer 131 latches and buffers the received external address EXADDR provided by the external input/output line (I/O), and generates a buffered address BADDR.

The address subtracter 133 converts the external address EXADDR buffered in the address buffer 131 (i.e., the buffered address BADDR) into an address difference value corresponding to a defined number shifting (e.g., delaying) clocks cycles (hereafter referred to as a "number of shift clocks", Nsc). From this value, the address subtracter 133 generates a subtraction address value, SADDR. The number of shift clocks Nsc may be defined by any integer equal to or greater than 1. In the illustrated embodiment, the number of shift clocks Nsc is assumed to be 1. Under this assumption, if the external address EXADDR is ADDR(N), the subtraction address SADDR is ADDR(N−1).

The address counter 135 generates the sequentially changing internal address (e.g., one or more address(es) corresponding to the burst mode operation) INADDRi based on the subtraction address SADDR. In one embodiment, the internal address INADDRi may be sequentially increased in response to a counted signal CNCLK and/or an output flag signal DOFL received from the control logic unit 180.

The address decoding unit 140 decodes the internal address INADDRi to specify access to particular memory cells within the normal cell array 111. In the illustrated embodiment, the external address EXADDR and the internal address INADDRi correspond to column addresses. Further, the internal address INADDRi, as decoded by the address decoding unit 140, is provided to the page buffer/Y-gate 113 associated with the normal cell array 111, such that data may be programmed to or read from the specified memory cells in normal cell array 111 via bit lines BL1 to BLm. (See, FIG. 5).

The redundancy enable unit 150 senses the generation of the internal address INADDRi corresponding to a predetermined embedded address READDR, and thus generates a first or second redundancy shift signal SRED1 or SRED2. As such, the embedded address READDR corresponds to an address generated in response to the counted signal CNCLK. As a result, before the normal cell array 111 would normally receive the internal address INADDRi which specifies a memory cell within the normal cell array 111 to be repaired, the redundancy enable unit 150 receives a corresponding address signal, albeit one shifted by the defined number of shift clocks Nsc.

Thus, in the illustrated exemplary embodiment and with the foregoing assumption regarding the defined number of shift clocks Nsc, when the address of a normal memory cell to be repaired is ADDR(N+1), the embedded address READDR is ADDR(N), and when the address of a normal memory cell to be repaired is ADDR(N), the embedded address READDR is ADDR(N−1), etc.

Continuing forward with the illustrated embodiment, the first redundancy shift signal SRED1 may be activated during the data input mode, whereas the second redundancy shift signal SRED2 may be activated during the data output mode. However, for convenience of description hereafter, the first and/or second redundancy shift signals SRED1 and SRED2 will be simply termed a "redundancy shift signal", without further designation.

In one embodiment, the redundancy enable unit 150 comprises a redundancy decider 151 and a redundancy shifter 153. The redundancy decider 151 comprises circuitry adapted to compare the embedded address READDR with the internal address INADDRi, and generates in response to this comparison the redundancy flag signal REDFL. For example, if the internal address INADDRi is equal to the embedded address READDR, the redundancy flag signal REDFL is activated.

Further, the redundancy shifter 153 comprises circuitry adapted to shift the activation interval of the redundancy flag signal REDFL in response to an input latch signal DLCLK1 and/or a shifting control signal RSCLK. That is, the redundancy shifter 153 may shift the activation interval of the redundancy flag signal REDFL in relation to the number of shift clocks Nsc, and provided the shifted results as the redundancy shift signal (e.g., SRED1 or SRED2).

In the data input mode, data input/output unit 160 is controlled such that data on the external input/output line (I/O) is applied to the normal cell array 111 or the redundant cell array 121 in response to the first redundancy shift signal SRED1. In the data output mode, the data input/output unit 160 is controlled such that data stored in the normal cell array 111 or the redundant cell array 121 is applied to the external input/output line (I/O) in response to the second redundancy shift signal SRED2. In one embodiment, the data input/output unit 160 comprises a data input driver 161, a data output multiplexer (MUX) 163 and a data latch buffer 165.

The data input driver 161 comprises circuitry adapted to receive data from the buffering input line BDI, as provided from the data latch buffer 165, and further adapted to provide the data to normal cell array 111 or the redundant cell array 121 in response to the input driving signal DICLK during the data input mode.

Alternatively, the circuitry comprising data input driver 161 may provide data received from the buffering input line BDI to the redundant cell array 121 instead of the normal cell array 111 in response to the activation of the first redundancy shift signal SRED1 during the data input mode. That is, if the first redundancy shift signal SRED1 is deactivated, the data input driver 161 operates such that data from the buffering input line BDI is provided to the normal cell array 111. However, if the first redundancy shift signal SRED1 activated, the data input driver 161 operates such that data from the buffering input line BDI is provided to the redundant cell array 121.

The data output multiplexer 163 comprises circuitry adapted to receive data from the redundant cell array 121, instead of data from the normal cell array 111, and provide it to the (muxing) output line MDO in response to the activation of the second redundancy shift signal SRED2 during the data output mode. However, if the second redundancy shift signal SRED2 is deactivated, the data output multiplexer 163 receives data from the normal cell array 111 and provides it to the muxing output line MDO.

The data latch buffer 165 comprises circuitry adapted to receive data from and drive data onto the external input/output line (I/O). Data thus received may be provided to the buffering input line BDI in response to the input latch signal DLCLK1 in the data input mode. Whereas, data to be driven onto external I/O line may be received from the muxing output line MDO in response to a redundancy shifting signal in data output mode. In one embodiment, the data latch buffer 165 is further adapted to latch data from an internal local output line LDO (not shown) in response to the output latch signal DLCLK2, and thereafter provide the latched data to the external input/output line (I/O) in response to a read enable signal /RE in the data output mode. In yet another embodiment, the operation of the data latch buffer 165, as between the data input mode and the data output mode, is controlled by an input/output control signal group SCON.

In the illustrated embodiment, the control logic unit 180 generally receives a chip enable signal /CE, the read enable signal /RE, a write enable signal /WE, a command latch enable signal CLE and an address latch enable signal ALE. The chip enable signal /CE may be used to select the semiconductor memory device. The read enable signal /RE may be used to control the output of data from the semiconductor memory device. The write enable signal /WE may be implemented so as to allow a command, an address, and/or input data to be latched in response to its rising edge(s). For example, when the command latch enable signal CLE is activated, a command may be latched at the rising edge of the write enable signal /WE. When the address latch enable signal ALE is activated, an address may be latched at the rising edge of the write enable signal /WE. When both the command latch enable signal CLE and the address latch enable signal ALE are deactivated, data may be latched at the rising edge of the write enable signal /WE.

The control logic unit 180 comprises circuitry adapted to generate an address input signal AICLK, an address initialization signal XIA, the counted signal CNCLK, the input latch signal DLCLK1, the output latch signal DLCLK2, the input driving signal DICLK, a shifting control signal RSCLK and the output flag signal DOFL.

Figure 6:
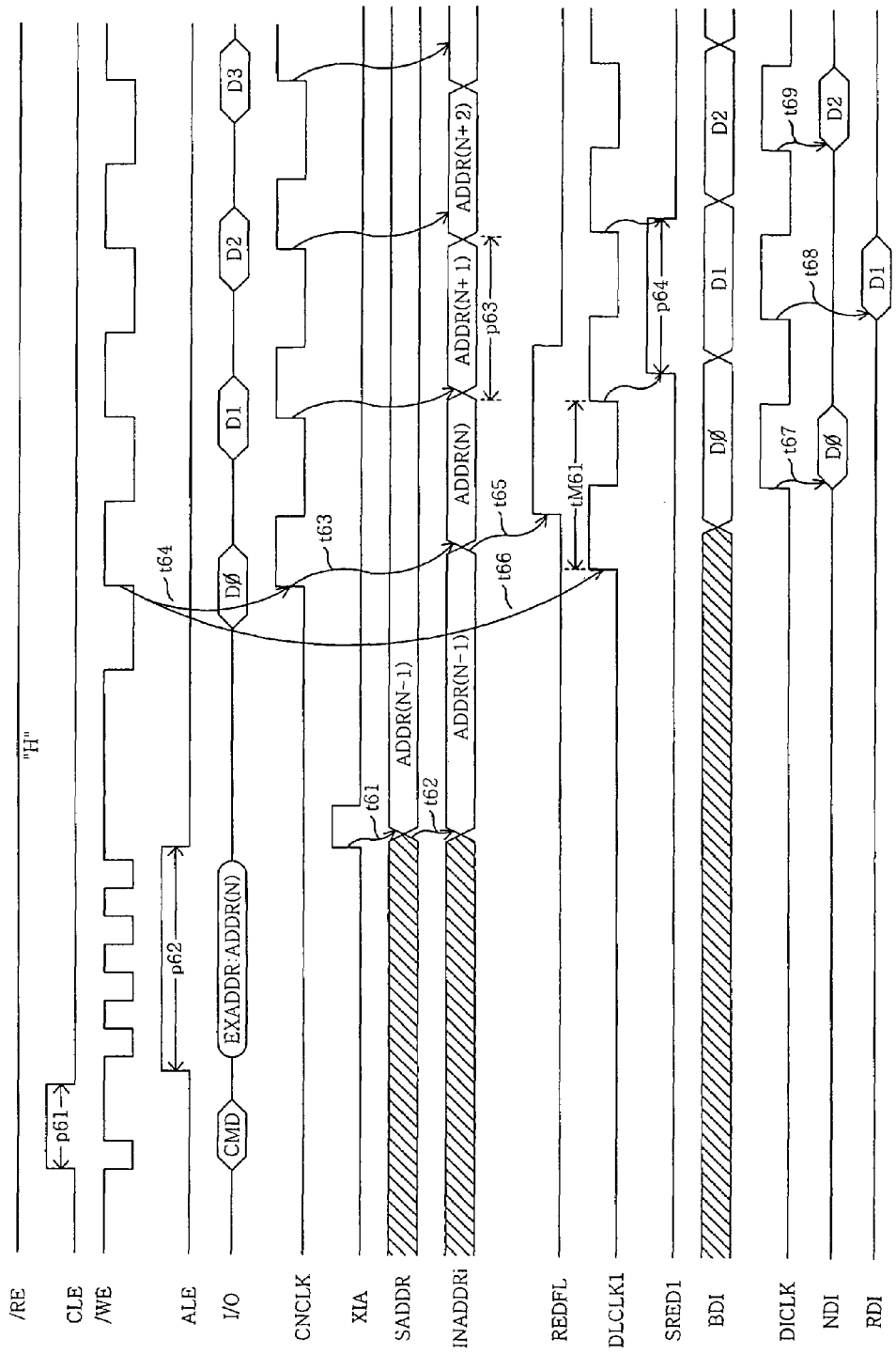
FIG. 6 is a timing diagram showing the redundancy operation of the semiconductor memory device of FIG. 4 in a data input mode.

FIG. 6 is a timing diagram showing the redundancy operation of the exemplar semiconductor memory device of FIG. 4 in the data input mode. In FIG. 6, the address of a memory cell to be repaired is assumed to be ADDR(N+1). Further, the number of shift clocks Nsc is assumed to be 1. In this case, the embedded address READDR of the redundancy decider 151 is ADDR(N). (See, FIG. 4).

Referring now to FIG. 6, in an interval p61, during which the command latch enable signal CLE is activated, a command controlling the operation mode of the semiconductor memory device is received. Then, in an interval p62, during which the address latch enable signal ALE is activated, the external address EXADDR received from the external input/output line (I/O) is buffered in response to a clock signal associated with the address input signal AICLK. In one particular embodiment, the address input signal AICLK is synchronized with the write enable signal NVE generated when the address latch enable signal ALE is activated.

Assuming the external address EXADDR is ADDR(N), the subtraction address SADDR output from the address subtracter 133 in response to the activation of the address initialization signal XIA at time t61 is ADDR(N−1).

Further, the internal address INADDRi output from the address counter 135 is ADDR(N−1) at time t62. In the illustrated example, the address initialization signal XIA is activated in response to the rising edge of the write enable signal /WE that is generated during the activation interval of the address latch enable signal ALE.

The internal address INADDRi sequentially increases in response to the counted signal CNCLK at time t63. In the data input mode, the counted signal CNCLK is activated in response to the rising edge of the write enable signal /WE after both the command latch enable signal CLE and the address latch enable signal ALE have been deactivated at time t64.

If the internal address INADDRi, equal to the embedded address READDR, is generated, the redundancy flag signal REDFL is activated at time t65. Further, the redundancy flag signal REDFL (e.g., its logic state or clock cycle) is shifted in response to the rising edge of the input latch signal DLCLK1 and, thus, the first redundancy shift signal SRED1 is generated.

In the data input mode, the input latch signal DLCLK1 is activated in response to the rising edge of the write enable signal NVE after both the command latch enable signal CLE and the address latch enable signal ALE have been deactivated at time t66.

Further, the input latch signal DLCLK1 is activated almost simultaneously with the counted signal CNCLK. As a result, and as shown in FIG. 6, the activation interval p64 for the first redundancy shift signal SRED1 corresponds to an interval p63 during which the internal address INADDRi is ADDR(N+1).

Meanwhile, data on the external input/output line (I/O) is latched in response to the input latch signal DLCLK1. Further, the latched data on the external input/output line (I/O) is provided to the buffering input line BDI. The data on the buffering input line BDI thus corresponds to the internal address INADDRi.

Data on the buffering input line BDI is driven onto the normal input line NDI or the redundancy input line RDI in response to the input driving signal DICLK at times t67, t68 and t69. The input driving signal DICLK is generated in response to the falling edge(s) of the input latch signal DLCLK1. Therefore, input data D0 and D2 corresponding to the internal address INADDRi, that is; ADDR(N) and ADDR(N+2), are driven onto the normal input line NDI at times t67 and t69, and input data D1 corresponding to the internal address INADDRi, that is, ADDR(N+1), is driven onto the redundancy input line RDI at time t68.

Figure 1:
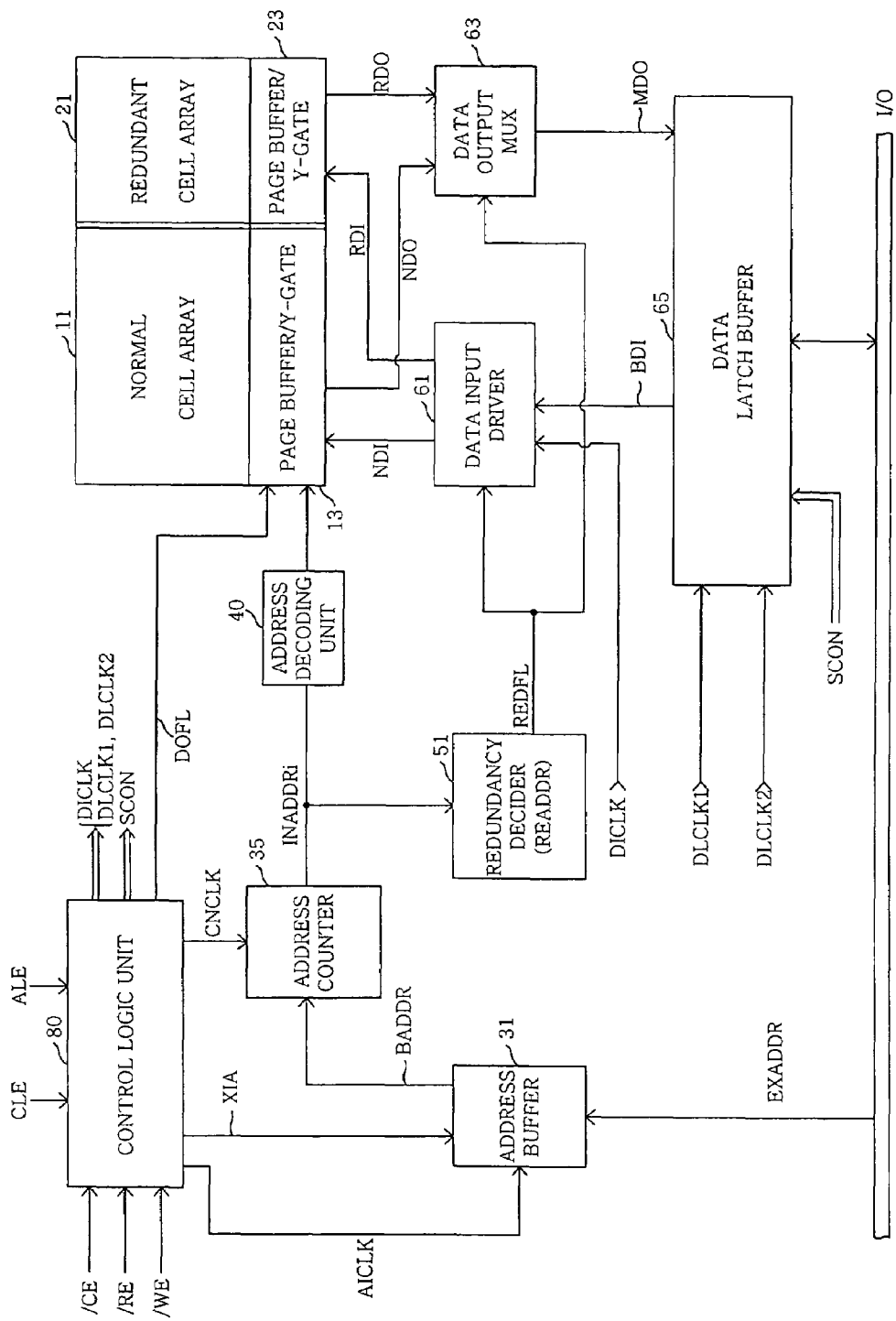
FIG. 1 is a block diagram of a conventional semiconductor memory device.
Figure 2:
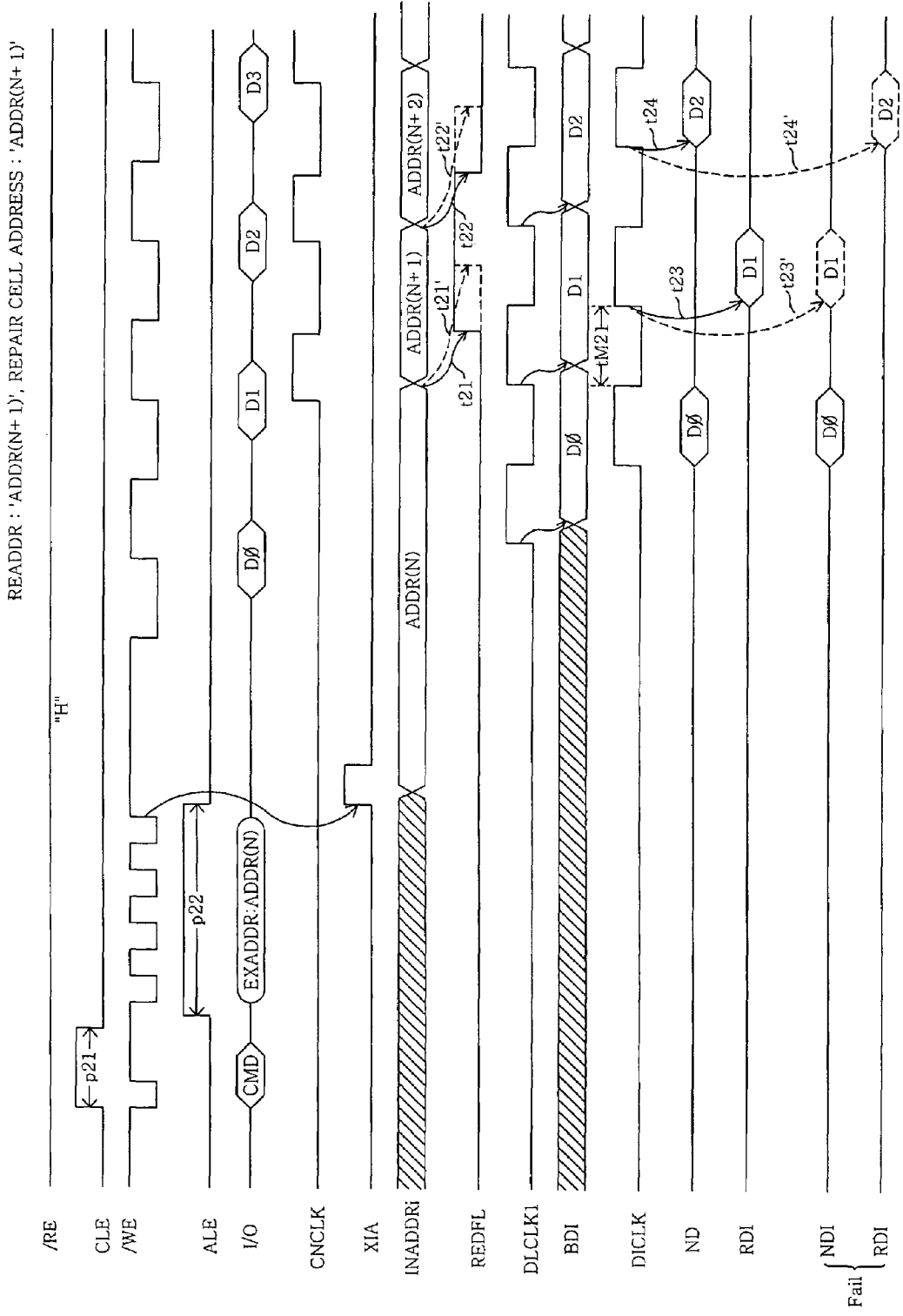
FIGS. 2 and 3 are timing diagrams showing the operation of the semiconductor memory device of FIG. 1 in a data input mode and a data output mode.
Figure 3:
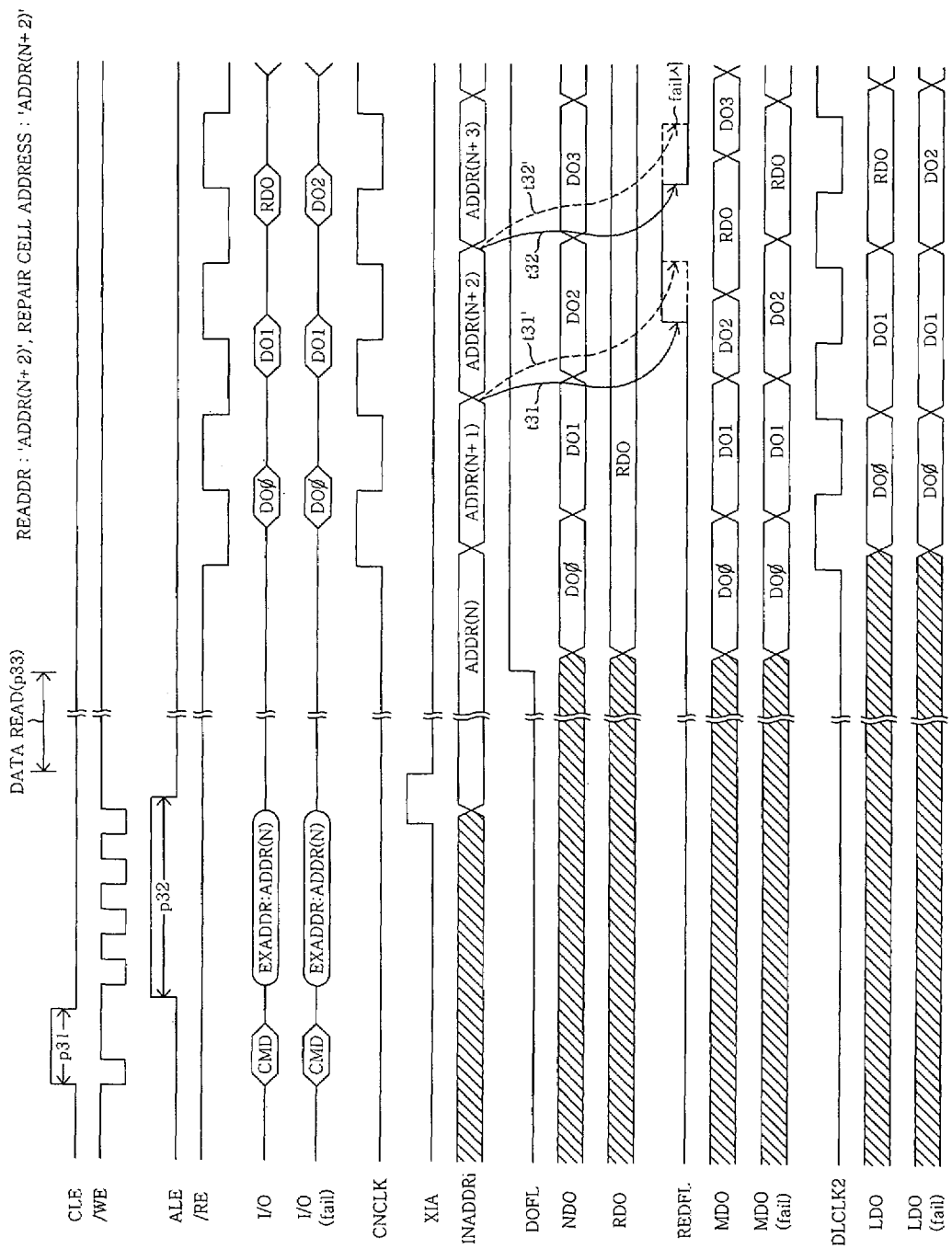

In FIG. 6, the response margin (e.g., the time from the generation of the internal address INADDRi to the time the redundancy flag signal REDFL is activated), is equal to about a single clock tM61 of the input latch signal DLCLK1, or a single clock of the write enable signal /NE. This represents a dramatic improvement over the response margin apparent in the conventional semiconductor memory device, like the one illustrated in FIG. 2.

Figure 7:
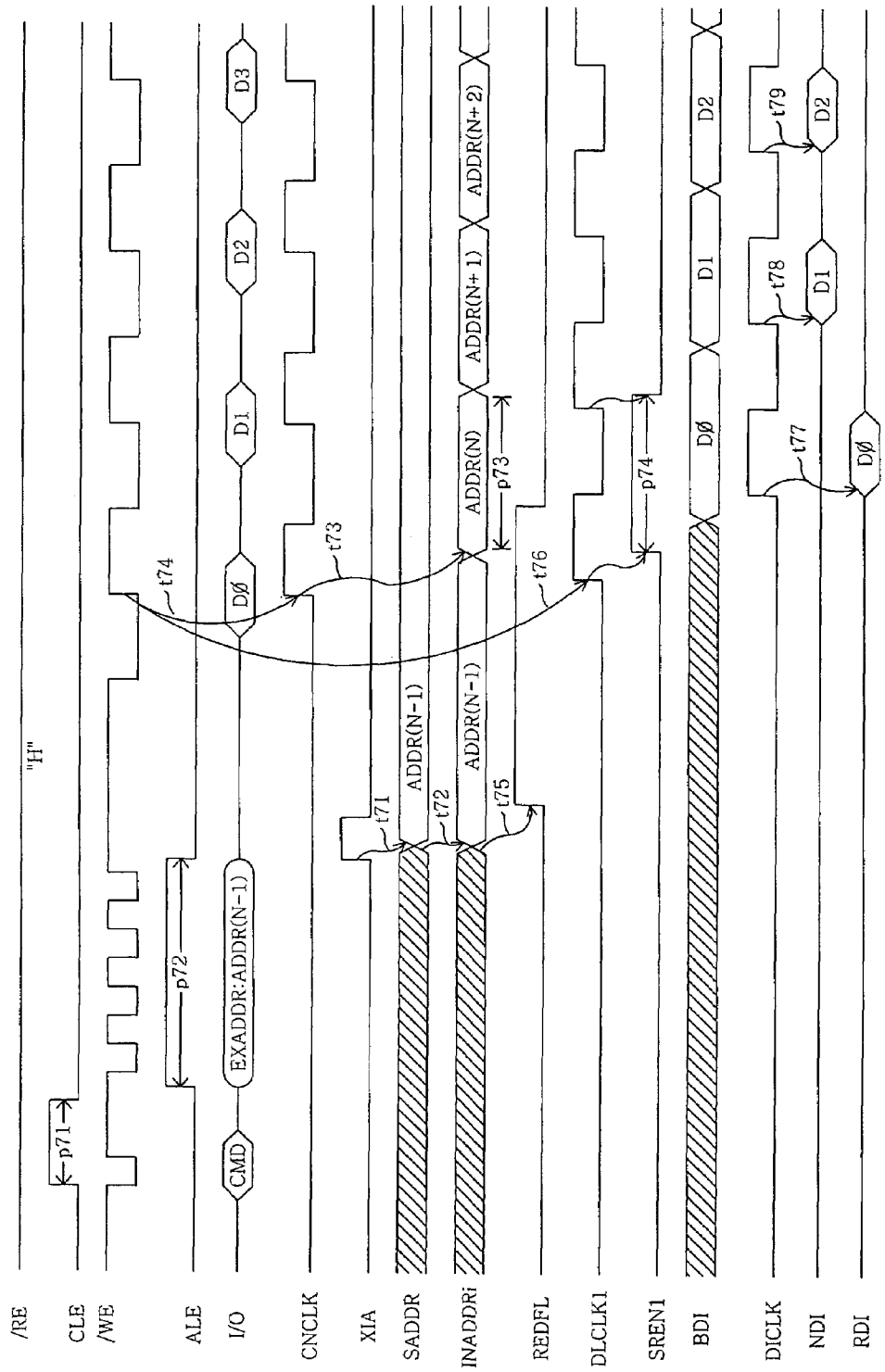
FIG. 7 is another timing diagram showing the redundancy operation of the semiconductor memory device of FIG. 4 in a data input mode.

FIG. 7 is another timing diagram showing the redundancy operation of an exemplary semiconductor memory device such as the one illustrated in FIG. 4 in the data input mode. In FIG. 7, the address of a memory cell to be repaired is assumed to be ADDR(N). In this case, the embedded address READDR of the redundancy decider 151 is "ADDR(N−1)". (See again, FIG. 4).

In intervals p71 and p72 and at times t71 to t74 and t76 in the timing diagram of FIG. 7, operations similar to those in intervals p61 and p62 and at times t61 to t64 and t66 in the timing diagram of FIG. 6 are performed.

First, in the interval p71, during which the command latch enable signal CLE is activated, a command for controlling an operation mode is received. Then, in the interval p72, during which the address latch enable signal ALE is activated, the external address EXADDR received from the external input/output line (I/O) is buffered in response to the address input signal AICLK.

In this case, when the external address EXADDR is ADDR(N), the subtraction address SADDR is ADDR(N−1) at time t71. Further, the internal address INADDRi output from the address counter 135 is ADDR(N−1) at time t72. Thereafter, the internal address INADDRi sequentially increases in response to the clock of the counted signal CNCLK at time t73.

In FIG. 7, the redundancy flag signal REDFL is activated in response to the first generation of the internal address INADDRi at time t75. Further, the logic state of the redundancy flag signal REDFL is shifted in response to the rising edge of the input latch signal CLCLK1 and, thus, the first redundancy shift signal SRED1 is generated.

Further, the input latch signal DLCLK1 is activated almost simultaneously with the counted signal CNCLK. As a result and as shown in FIG. 6, the activation interval p74 of the first redundancy shift signal SRED1 corresponds to the interval p73, during which the internal address INADDRi is "ADDR(N)".

Further, data from the external input/output line (I/O) is latched in response to the clock of the input latch signal DLCLK1. In this case, the latched data from the external input/output line (I/O) is provided to the buffering input line BDI. Thereafter, the data on the buffering input line BDI is driven to the normal input line NDI or the redundancy input line RDI in response to the input driving signal DICLK.

Therefore, input data D0 corresponding to the internal address INADDRi, that is, ADDR(N), is driven to the redundancy input line RDI at time t77, and input data D1 and D2 corresponding to the internal addresses INADDRi, that is, ADDR(N+1) and ADDR(N+2), are driven to the normal input line NDI at times t78 and t79.

As in the case illustrated in FIG. 7, even when the address of a memory cell to be repaired is equal to the external address EXADDR, a redundancy operation is successfully performed similar to the case illustrated in FIG. 6.

Figure 8:
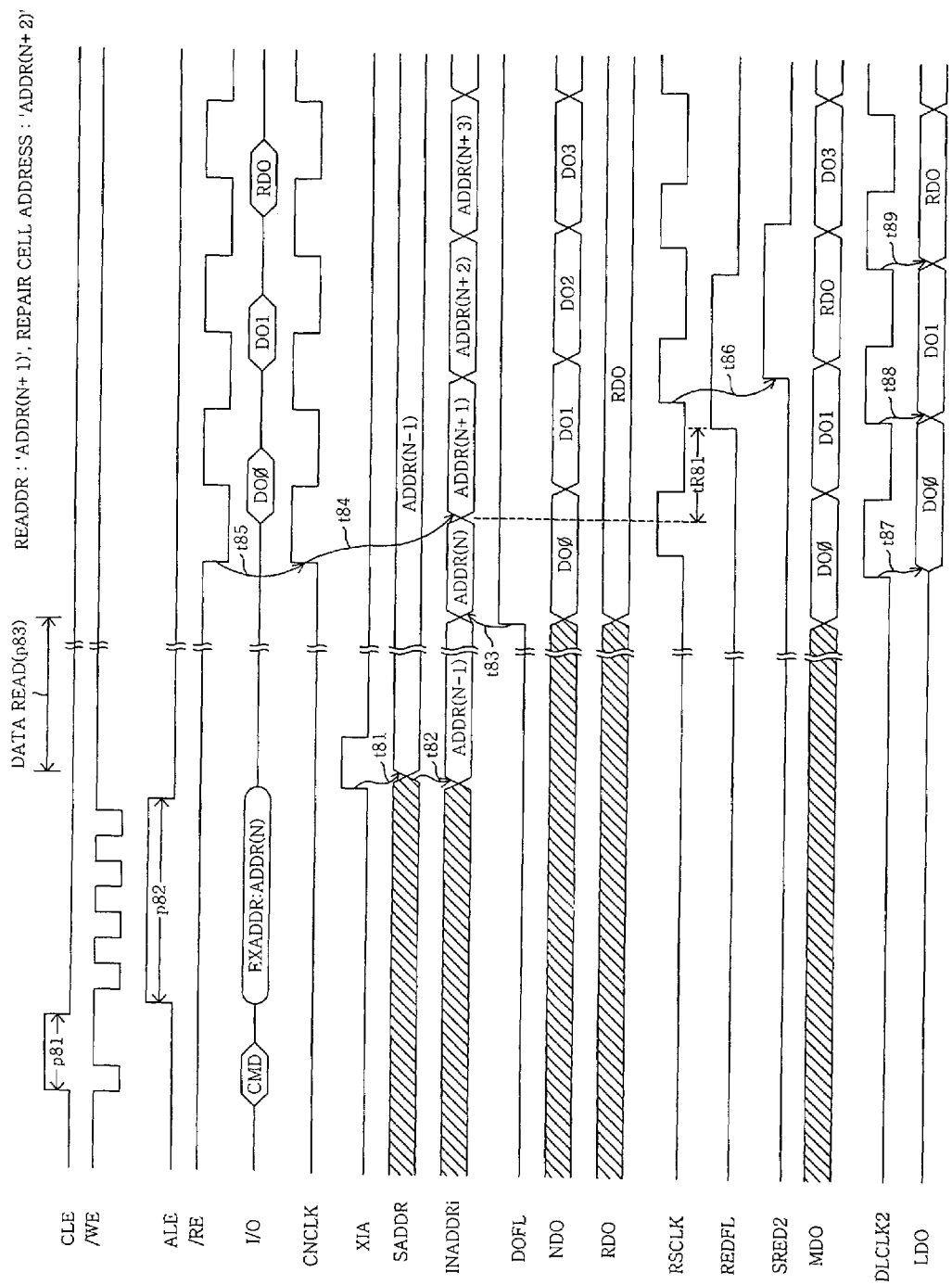
FIG. 8 is a timing diagram showing the redundancy operation of the semiconductor memory device of FIG. 4 in a data output mode.

FIG. 8 is a timing diagram showing the redundancy operation of an exemplary semiconductor memory device like the one illustrated in FIG. 4 in the data output mode. In FIG. 8, the address of a memory cell to be repaired is assumed to be ADDR(N+2). In this case, the embedded address READDR of the redundancy decider 151 is ADDR(N+1). (See again, FIG. 4).

First, with reference to FIG. 8 and as similar to FIG. 6, in an interval p81, during which the command latch enable signal CLE is activated, a command for controlling the operation mode of the semiconductor memory device is received. Further, in an interval p82, during which the address latch enable signal ALE is activated, an address received from the external input/output line (I/O) is buffered and stored. In this case, when the external address EXADDR is ADDR(N), the subtraction address SADDR, output from the address subtracter 133 in response to the activation of the address initialization signal XIA, is ADDR(N−1) at time t81. Further, the internal address INADDRi, output from the address counter 135, is ADDR(N−1) at time t82.

Then, in the data output mode illustrated in FIG. 8, a data read interval p83 is entered. During the data read interval p83, data DO0, DO1, DO2, DO3 and RDO stored in the memory cells of the normal cell array 111 and the redundant cell array 121 are latched into the page buffers 113 and 123.

In this case, the internal address INADDRi increases in response to the rising edge of the data output flag DOFL at time t83. That is, when the data output flag DOFL is activated, the internal address INADDRi increases from ADDR(N−1) to ADDR(N). In this case, the data output flag DOFL indicates that the semiconductor memory device has terminated the data read operation and is ready to output data. After a point where the data output flag DOFL is activated, the data stored in the page buffer is output through a predetermined data output path in response to the read enable signal /RE received by the control logic unit 180.

The first change of the internal address INADDRi is performed in response to the data output flag DOFL, and the second and subsequent changes are performed in response to the counted signal CNCLK.

After the data read interval p83, a procedure of outputting data stored in the page buffers 113 and 123 to a circuit external to the semiconductor memory device is performed. Thus, the data from the memory cell of the normal cell array 111 corresponding to the internal address INADDRi, is decoded by the address decoding unit 140 and provided to the normal output line NDO.

Meanwhile, the internal address INADDRi sequentially increases in response to the counted signal CNCLK at time t84. At this time, the counted signal CNCLK is activated in response to the falling edge of the read enable signal /RE in the data output mode at time t85.

Further, when the internal address INADDRi, equal to the embedded address READDR, is generated, the redundancy flag signal REDFL is activated. In FIG. 8, if the internal address INADDRi corresponding to "ADDR(N+1)" is generated, the redundancy flag signal REDFL is activated after a predetermined response time tR81.

Further, the logic state of the redundancy flag signal REDFL is shifted to the second redundancy shift signal SRED2 in response to the rising edge of the shifting control signal RSCLK at time t86. In this case, the shifting control signal RSCLK is activated in response to the falling edge of the read enable signal /RE in the data output mode, similar to the counted signal CNCLK.

Preferably, the response time of the shifting control signal RSCLK is longer than that of the counted signal CNCLK. As a result, the activation of the second redundancy shift signal SRED2 occurs after the internal address INADDRi has increased to ADDR(N+2).

Further, data on the normal output line NDO or the redundancy output line RDO is provided to the muxing output line MDO in response to the second redundancy shift signal SRED2. That is, when the internal address INADDRi is ADDR(N) and ADDR(N+1), data DO0 and DO1 on the normal output line NDO are provided to the muxing output line MDO. When the internal address INADDRi is ADDR(N+2), data on the redundancy output line RDO is provided to the muxing output line MDO.

Further, data on the muxing output line MDO is provided to the local output line LDO in response to the clock of the output latch signal DLCLK2 at times t87, t88 and t89. Thereafter, data on the local output line LDO is provided to the external input/output line (I/O) in response to the read enable signal /RE. At this time, the output latch signal DLCLK2 is activated in response to the falling edge of the read enable signal /RE in the data output mode.

In FIG. 8, a data transfer window on the muxing output line MDO, corresponding to each address, is obtained and corresponds to about 1 clock cycle of the read enable signal /RE, regardless of the response time defined by the generation of the internal address INADDRi to the activation of the redundancy flag signal REDFL. In this case, the precision of data output on the muxing output line MDO and latched in response to the output latch signal DLCLK2 is further improved.

Figure 9:
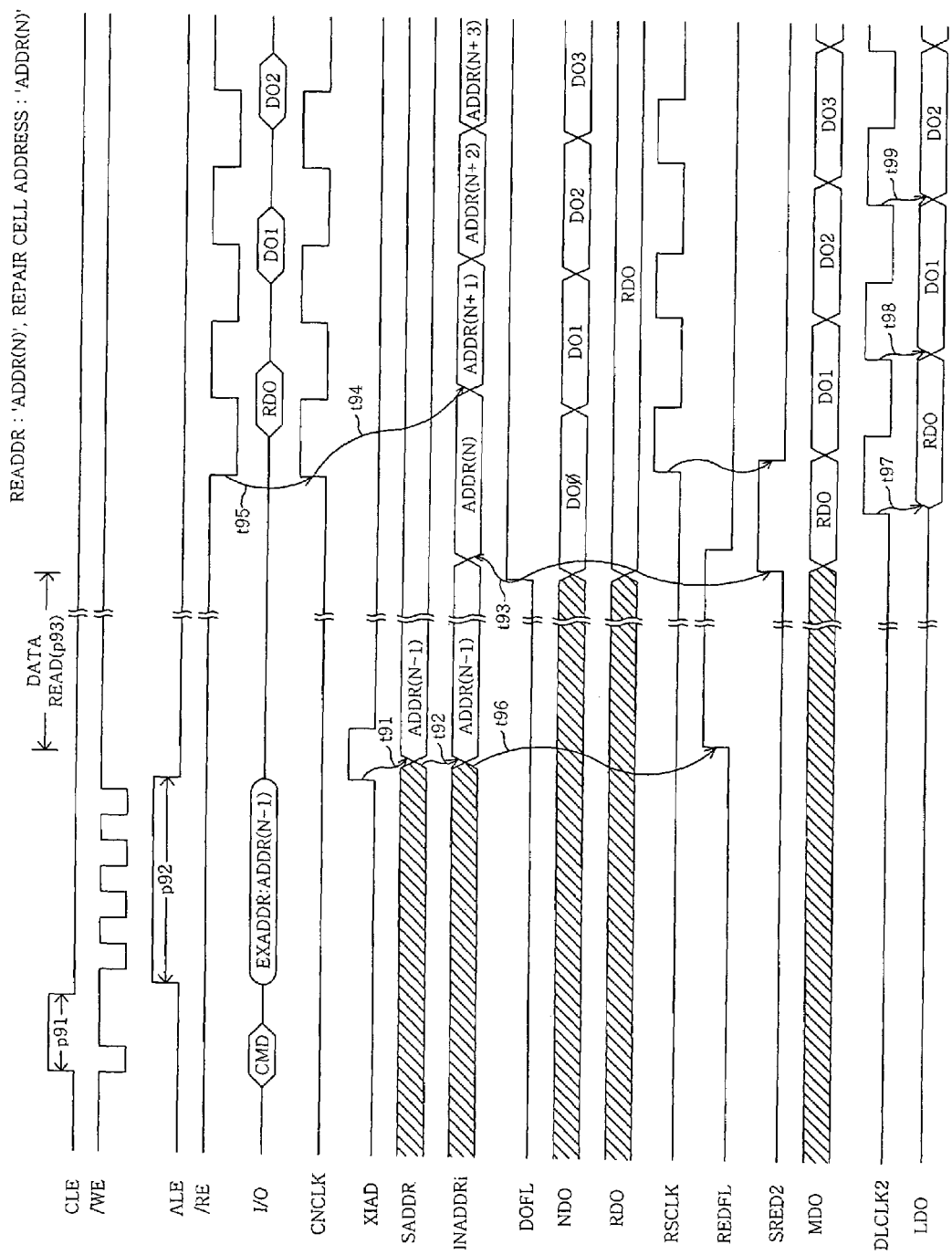
FIG. 9 is another timing diagram showing the redundancy operation of the semiconductor memory device of FIG. 4 in a data output mode.

FIG. 9 is another timing diagram showing the redundancy operation for an exemplary semiconductor memory device like the one illustrated in FIG. 4 in the data output mode. In FIG. 9, the address of a memory cell to be repaired is assumed to be ADDR(N). In this case, the embedded address READDR of the redundancy decider 151 is ADDR(N−1). (See again, FIG. 4).

In intervals p91 to p93 and at times t91 to t95, as illustrated in the timing diagram of FIG. 9, operations similar to those performed in the intervals p81 to p83 and at times t81 to t85 in the timing diagram of FIG. 8 are performed.

First, in an interval p91, during which the command latch enable signal CLE is activated, a command for controlling the operation mode of the semiconductor memory device is received. Further, in an interval p92, during which the address latch enable signal ALE is activated, an address received from the external input/output line (I/O) is buffered and stored. In this case, a subtraction address SADDR output from the address subtracter 133 is ADDR(N−1) at time t91. Further, the internal address INADDRi output from the address counter 135 is ADDR(N−1) at time t92.

Subsequently, a data read interval p93 is entered. In response to the rising edge of the data output flag DOFL, the internal address INADDRi increases at time t93. That is, if the data output flag DOFL is activated, the internal address INADDRi increases from ADDR(N−1) to ADDR(N). Thereafter, the change of the internal address INADDRi is performed in response to the counted signal CNCLK.

After the data read interval p93, a procedure outputting the data stored in the page buffers 113 and 123 to a circuit external to the semiconductor memory device is performed.

In the case of FIG. 9, the redundancy flag signal REDFL is activated in response to the first generation of the internal address INADDRi at time t96. Further, the logic state of the redundancy flag signal REDFL is shifted to the second redundancy shift signal SRED2 in response to the rising edge of the data output flag DOFL.

Further, data on the normal output line NDO or the redundancy output line RDO is provided to the muxing output line MDO in response to the second redundancy shift signal SRED2. That is, when the internal address INADDRi is ADDR(N), data RDO on the redundancy output line RDO is provided to the muxing output line MDO. When the internal address INADDRi is ADDR(N+1) and ADDR(N+2), data DO1 and DO2 on the normal output line NDO are provided to the muxing output line MDO.

Further, data on the muxing output line MDO is provided to the local output line LDO in response to the output latch signal DLCLK2 at times t97, t98 and t99. Thereafter, data on the local input/output line LDO is provided to the external input/output line (I/O) in response to the read enable signal /RE.

As in the case illustrated in FIG. 9, even when the address of a memory cell to be repaired is equal to the external address EXADDR, a redundancy operation is successfully performed similar to the case illustrated in FIG. 8.

Within a semiconductor memory device configured according to one embodiment of the invention, a redundancy enable unit senses the generation of an internal address corresponding to an embedded address, and generates a redundancy flag signal in response. In this case, the embedded address is an address preceding (by at least one clock) the address of the memory cell of the normal cell array to be repaired. Further, the time point to which the redundancy shift signal is to be activated is shifted from the time point at which the redundancy flag signal is activated in response to a clock corresponding to the address of the memory cell to be repaired. Further, the redundant cell array, instead of the normal cell array, is selected in response to the redundancy shift signal in the data input mode and the data output mode.

According to one or more embodiments of the invention, the margin associated with the redundancy flag signal, as defined in time from the generation of a corresponding internal address INADDRi to the activation of a redundancy flag signal REDFL, is remarkably increased during a redundancy driving operation in a data input/output mode.

Although several embodiments of the invention have been described for illustrative purposes, those skilled in the art will appreciate that various modifications, additions and substitutions are possible, without departing from the scope of the invention as defined by the following claims.

For example, the foregoing discussion of an exemplary embodiment is directed to a redundancy structure in which a burst operation of continuously changing a column address is performed and a memory cell in a specific column of a normal cell array is replaced with a memory cell of a redundant cell array. However, it will be apparent to those skilled in that art that the foregoing examples may be applied to semiconductor memory devices having a different configuration, such as one having a redundancy structure, in which a burst operation of continuously changing a row address is performed and a memory cell in a specific row of a normal cell array is replaced with the memory cell of a redundant cell array.

Additionally, the exemplary logic states defining activated and deactivated signals as well as signal transitions might readily be reversed (i.e., high to low, and low to high; falling to rising and rising to falling, etc.).

What is claimed is:

1. A semiconductor memory device, comprising:
   a normal cell array comprising a plurality of memory cells arranged in a matrix of rows and columns;
   a redundant cell array comprising a plurality of memory cells adapted to replace memory cells in the normal cell array;
   an address input unit adapted to generate an internal address that sequentially changes in response to a counted signal;
   an address decoding unit for decoding the internal address to specify a memory cell in the normal cell array;
   a redundancy enable unit adapted to generate a redundancy shift signal that is activated in response to the generation of the internal address corresponding to an embedded address; and
   a data input/output unit controlled such that input data is provided to the redundant cell array instead of the normal cell array in response to the redundancy shift signal;
   wherein the embedded address corresponds to an internal address preceding the internal address specifying a memory cell in the normal cell array to be repaired by a number of shift clocks, wherein the number of shift clocks is defined by an integer equal to or greater than 1.

2. The semiconductor memory device of claim 1, wherein the redundancy enable unit comprises:
   a redundancy decider adapted to activate a redundancy flag signal in response to generation of the internal address corresponding to the embedded address; and
   a redundancy shifter adapted to generate the redundancy shift signal by shifting the activation point of the redundancy flag signal in time according to the number of shift clocks.

3. The semiconductor memory device of claim 1, wherein the data input/output unit comprises a data input driver controlled such that input data is applied to a redundancy input line associated with the redundant cell array, instead of a normal input line associated with the normal cell array, in response to the redundancy shift signal.

4. The semiconductor memory device of claim 1, wherein the address input unit comprises:
   an address subtracter adapted to generate a subtraction address by converting a received external address into an address difference value in relation to the number of shift clocks; and,
   an address counter adapted to generate the internal address in response to the subtraction address and the counted signal.

5. The semiconductor memory device of claim 1, wherein the normal cell array comprises NAND-type non-volatile memory cells.

6. The semiconductor memory device of claim 2, wherein the redundancy shift signal is activated in response to an input latch signal defining a latch state for input data associated with the internal address of the memory cell to be repaired.

7. A flash memory device adapted for use in a burst mode operation, comprising:
   a normal cell array comprising a plurality of NAND-type non-volatile memory cells arranged in a matrix of rows and columns;
   a redundant cell array comprising a plurality of NAND-type non-volatile memory cells adapted to replace the NAND-type non-volatile memory cells of the normal cell array;
   an address input unit adapted to generate an internal address that sequentially changes in response to a counted signal and in accordance with a burst value defining the burst operation;
   an address decoding unit adapted to decode the internal address to specify a memory cell in the normal cell array;
   a redundancy enable unit adapted to generate a redundancy shift signal in response to the generation of an internal address corresponding to a predetermined embedded address; and
   a data input/output unit controlled such that data from the redundant cell array, instead of the normal cell array, is output in response to the redundancy shift signal;
   wherein the embedded address corresponds to an internal address preceding the internal address specifying a memory cell in the normal cell array to be repaired by a number of shift clocks, wherein the number of shift clocks is defined by an integer equal to or greater than 1.

8. The semiconductor memory device of claim 7, wherein the redundancy enable unit comprises:
- a redundancy decider adapted to activate a redundancy flag signal in response to generation of the internal address corresponding to the embedded address; and
- a redundancy shifter adapted to generate the redundancy shift signal by shifting the activation point of the redundancy flag signal in time according to the number of shift clocks.

9. The semiconductor memory device of claim 7, wherein the data input/output unit comprises a data output multiplexer controlled such that output data is received from a redundancy output line associated with the redundant cell array, instead of a normal output line associated with the normal cell array, in response to the redundancy shift signal.

10. The semiconductor memory device of claim 7, wherein the address input unit comprises:
- an address subtracter adapted to generate a subtraction address by converting a received external address into an address difference value in relation to the number of shift clocks; and,
- an address counter adapted to generate the internal address in response to the subtraction address and the counted signal.

11. The semiconductor memory device of claim 8, wherein the redundancy shift signal is activated in response to an input latch signal defining a latch state for input data associated with the internal address of the memory cell to be repaired.

12. A redundancy driving method for a semiconductor memory device comprising a normal cell array and a redundancy cell array, comprising:
- generating a sequentially changing internal address that specifies a memory cell in the normal cell array in response to a counted signal;
- sensing generation of an internal address corresponding to an embedded address, activating a redundancy flag signal, and in response generating a redundancy shift signal from the redundancy flag signal; and
- controlling a data input operation such that input data is applied to the redundant cell array instead of the normal cell array in response to the redundancy shift signal;
- wherein the embedded address corresponds to an internal address preceding the internal address specifying a memory cell in the normal cell array to be repaired by a number of shift clocks, wherein the number of shift clocks is defined by an integer equal to or greater than 1.

13. The redundancy driving method of claim 12, wherein generating the redundancy shift signal comprises:
- activating the redundancy flag signal in response to generation of the internal address corresponding to the embedded address; and
- shifting activation of the redundancy flag signal in time by the number of shift clocks.

14. The redundancy driving method of claim 13, wherein the redundancy shift signal is activated in response to an input latch signal adapted to control latching of input data corresponding to the address of the memory cell to be repaired.

15. The redundancy driving method of claim 13, wherein generating the internal address comprises:
- generating a subtraction address from a received external address in relation to an address difference value and the number of shift clocks; and,
- generating the internal address in response to the subtraction address and the counted signal.

16. A redundancy driving method for a semiconductor memory device comprising a normal cell array and a redundancy cell array, comprising:
- generating a sequentially changing internal address that specifies a memory cell in the normal cell array in response to a counted signal;
- sensing generation of an internal address corresponding to an embedded address, activating a redundancy flag signal, and in response generating a redundancy shift signal from the redundancy flag signal; and
- controlling a data output operation such that output data is received from the redundant cell array instead of the normal cell array in response to the redundancy shift signal;
- wherein the embedded address corresponds to an internal address preceding the internal address specifying a memory cell in the normal cell array to be repaired by a number of shift clocks, wherein the number of shift clocks is defined by an integer equal to or greater than 1.

17. The redundancy driving method of claim 16, wherein generating the redundancy shift signal comprises:
- activating the redundancy flag signal in response to generation of the internal address corresponding to the embedded address; and
- shifting activation of the redundancy flag signal in time by the number of shift clocks.

18. The redundancy driving method of claim 16, wherein generating the internal address comprises:
- generating a subtraction address from a received external address in relation to an address difference value and the number of shift clocks; and,
- generating the internal address in response to the subtraction address and the counted signal.

* * * * *